United States Patent [19]
Jordan

[11] Patent Number: 5,317,199
[45] Date of Patent: May 31, 1994

[54] RAMP GENERATOR SYSTEM
[75] Inventor: Edward P. Jordan, Greensboro, N.C.
[73] Assignee: Analog Devices, Inc., Norwood, Mass.
[21] Appl. No.: 37,701
[22] Filed: Mar. 25, 1993

Related U.S. Application Data
[63] Continuation of Ser. No. 877,082, May 1, 1992, abandoned.
[51] Int. Cl.[5] ............ H03K 4/08; H03K 5/12; H03K 4/10
[52] U.S. Cl. .................. 307/228; 307/263; 328/181
[58] Field of Search ........... 307/228, 263, 269, 242, 307/246; 328/36, 62, 71, 127, 142, 181

[56] References Cited
U.S. PATENT DOCUMENTS

| | | | |
|---|---|---|---|
| 4,228,366 | 10/1980 | Hüttemann et al. | 307/228 |
| 4,359,649 | 11/1982 | Mündel | 307/228 |
| 4,360,747 | 11/1982 | Ryan | 307/228 |
| 4,475,427 | 10/1984 | Starkey | 307/228 |
| 4,611,176 | 9/1986 | Jatko et al. | 307/228 |
| 4,705,961 | 11/1987 | Ainsworth et al. | 307/228 |
| 4,739,228 | 4/1988 | Viscardi et al. | 307/228 |
| 4,803,381 | 2/1989 | Gornati et al. | 307/228 |

Primary Examiner—William L. Sikes
Assistant Examiner—Trong Phan
Attorney, Agent, or Firm—Joseph S. Iandiorio

[57] ABSTRACT

An improved ramp generator system includes a plurality of ramp generator circuits; a ramp rate signal source for controlling the ramp slope; a ramp voltage signal source for establishing the starting voltage of the ramp; a ramp starting signal source for starting the ramp; a device for defining a plurality of ramp periods; and a switching device, responsive to the device for defining the ramp periods, for alternately, sequentially connecting the ramp rate signal source, ramp voltage signal source, and ramp starting signal source, to each of the ramp generator circuits for producing a series of identical ramps.

14 Claims, 2 Drawing Sheets

RAMP GENERATOR SYSTEM

This is a continuation of application Ser. No. 07/877,082, filed May 1, 1992, abandoned.

FIELD OF INVENTION

This invention relates to an improved ramp generator system, and more particularly to such an improved ramp generator system which provides more accurate pulse alignment for high-speed pulse width modulation.

BACKGROUND OF INVENTION

Conventional ramp generators reset or restart the ramp after each new pulse is generated upon the ramp reaching a predetermined level relative to some reference. In pulse width modulating circuits the reference is typically the output of a digital to analog converter (DAC) which is constantly changing. As higher and higher pulse rates are demanded the speed of the ramp circuit reset and the DAC settling time cannot keep pace. To accommodate this two or more channels are established, each with its own ramp generator and DAC to provide alternate pulses in a stream so that each one has the time to fully reset while the other is providing a pulse. This approach raises other problems. Each channel has a different reset settling characteristic if they are reset at different times, so each channel will not have enough time to reach its final value before it is triggered again. This causes each ramp to start at a different voltage level. Different initial voltage levels cause the time it takes the ramp to reach a fixed reference level to vary. And each ramp may have a slightly different slope. Therefore the same DAC input in each channel may result in a different pulse width output. In such multichannel systems the circuit complexity is increased by the need for close matching in all details in order to insure that the currents consistently match, the setting is identical and the ramps start at the same time and at the same voltage level. Even so, serious pulse misalignment occurs and the accuracy of the pulse width modulation suffers.

SUMMARY OF INVENTION

It is therefore an object of this invention to provide an improved, simpler and more accurate high-speed ramp generator system.

It is a further object of this invention to provide such an improved ramp generator which reduces system complexity.

It is a further object of this invention to provide such a improved ramp generator which reduces pulse misalignment.

It is a further object of this invention to provide such an improved ramp generator which can be implemented with a smaller integrated circuit with better performance.

It is a further object of this invention to provide such an improved ramp generator with reduced matching requirements for circuit components and performance.

It is a further object of this invention to provide such an improved ramp generator in which each ramp starts at the same voltage, regardless of when the ramp is reset.

It is a further object of this invention to provide such an improved ramp generator in which each ramp starts at the same time.

It is a further object of this invention to provide such an improved ramp generator in which each ramp has the same slope.

It is a further object of this invention to provide such an improved ramp generator which requires only one power source.

The invention results from the realization that a truly accurate, high-speed ramp generator can be achieved by using a number of ramp generator circuits all supplied alternately, in sequence, with the same ramp start time signal, ramp start voltage signal, and ramp slope signal, so that each ramp, no matter from which ramp generator circuit it is produced, has the same starting time and level and the same slope.

This invention features an improved ramp generator system including a plurality of ramp generator circuits. There is a ramp rate signal source for controlling the ramp slope; a ramp voltage signal source for establishing the starting voltage of the ramp; and a ramp starting signal source for starting the ramp. There are also means for defining a plurality of ramp periods and switching means, responsive to the means, for defining, for alternately, sequentially connecting the ramp rate signal source, the ramp voltage signal source, and the ramp starting signal source, to each of the ramp generator circuits for producing a series of identical ramps.

In a preferred embodiment the periods may be equal. Each of the ramp generator circuits may include an RC network and a switching device. The ramp starting signal source may be connected by the switching means to the control terminal of the switching device. The ramp rate signal source may be connected by the switching means to the capacitive portion of the RC network. The ramp voltage signal source may be connected by the switching means to a load terminal of the switching device for fixing the ramp starting voltage at the supply voltage minus the voltage drop across the switching device. There may be just two ramp generator circuits and two ramp periods which differentially operate the switching means.

The invention also features the differential dual-ramp generator system which includes first and second ramp generator circuits. There is a ramp rate signal source for controlling the ramp slope; a ramp voltage signal source for establishing the starting voltage of the ramp; and a ramp starting signal source for starting the ramp. There are means for defining first and second ramp periods and switching means are provided responsive to the means for defining for alternately, sequentially connecting the ramp rate signal source, the ramp voltage signal source, and the ramp starting signal source to each of the ramp generator circuits for producing a series of identical ramps.

In a preferred embodiment the ramp generator circuits may include an RC network and a switching device. The ramp starting signal source may be connected by the switching means to the control terminal of the switching device. The ramp rate signal source may be connected by the switching means to the capacitive portion of the RC network. The ramp voltage signal source may be connected by the switching means to a load terminal of the switching device for fixing the ramp starting voltage at the supply voltage minus the voltage drop across the switching device. The first and second periods may be equal in duration.

DISCLOSURE OF PREFERRED EMBODIMENT

Other objects, features and advantages will occur to those skilled in the art from the following description of a preferred embodiment and the accompanying drawings, in which.

This invention may be accomplished with an improved ramp generator system which includes a plurality of ramp generator circuits, e.g., two, which can be operated differentially whereby each has a 50% duty cycle so that each ramp generator is on for the same amount of time. There is a ramp rate signal source for controlling the ramp slope and a ramp voltage signal source for establishing the starting voltage of the ramp. There is also a ramp starting signal source for starting the ramp at the appropriate moment as the system transitions differentially between the two periods. There is some means for defining the plurality of ramp periods in the case where there are but two ramp generator circuits this can be simply a divide by two circuit which operates switching means which alternately sequentially connect the ramp rate signal source and the ramp starting signal source to one of the ramp generator circuits while the ramp voltage signal source is applied to the other. Each time the divide by two circuit or other circuit for defining a plurality of ramp periods transitions from one state to the next, the switching means interchanges the connections so that the ramp circuit which was settling becomes energized to produce a ramp and the ramp generator circuit which was producing a ramp now has a chance to settle.

Figure 1:
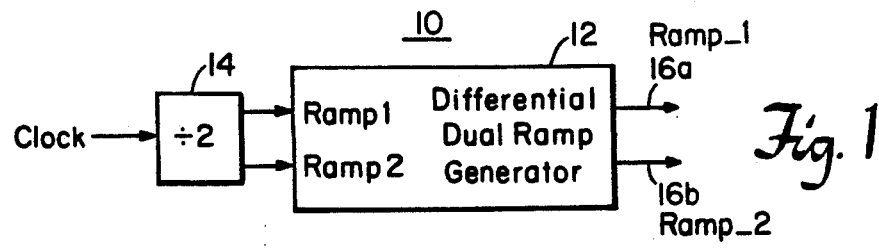
FIG. 1 is a block diagram of a differential dual-ramp generator system according to this invention.

There is shown in FIG. 1 a ramp generator system 10 according to this invention which includes a differential dual-ramp generator 12 operated by divide by two circuit 14 driven by a clock signal at its input. The alternating signals from divide by two circuit 14 alternately actuate ramp₁31 and ramp__2 at the outputs 16a and 16b, respectively, of generator 12.

Figure 2:
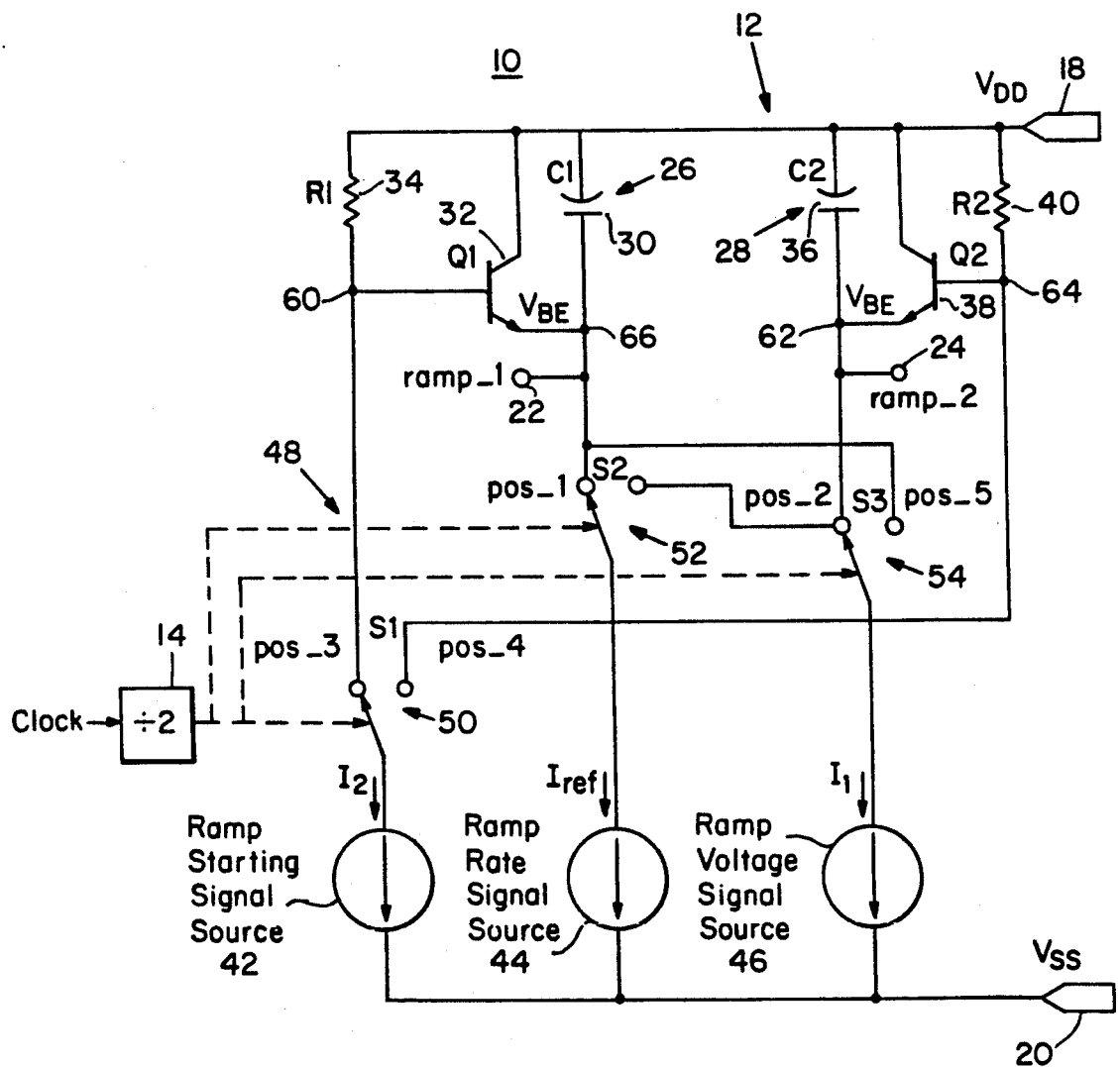
FIG. 2 is a more detailed schematic of the system of FIG. 1.

Differential dual-ramp generator 12, FIG. 2, receives at its input terminals 18 and 20 the supply voltages $V_{DD}$ and $V_{SS}$, respectively. Ramp 1 is provided at output 22 and ramp 2 is provided at output 24. There are two ramp generator circuits 26 and 28. Ramp generator circuit 26 includes capacitor 30 C1, transistor 32 Q1, and resistor 34 R1. Ramp generator circuit 28 includes capacitor 36 C2, transistor 38 Q2, and resistor 40 R2. There are three current sources: the ramp starting signal source 42 which supplies I2; the ramp rate signal source 44 which provides Iref; and the ramp voltage signal source 46 which supplies I1. Switching device 48 includes switch 50, S1, which moves between position 3 and position 4; switch 52, S2, which moves between position 1 and position 2; and switch 54, S3, which moves between position 2 and position 5.

In operation, divide by two circuit 14 toggles the swingers of switches 50, 52 and 54 back and forth for equal periods to provide the dual differential mode of operation. Switch 50 moves between positions 3 and 4, switch 52 between positions 1 and 2, and switch 54 between positions 2 and 5. If all of the switches are in the position in which they are presently shown in FIG. 2, ramp starting signal source 42 and ramp rate signal source 44 are connected to ramp generator circuit 26. The ramp starting signal source, supplying I2, causes a voltage at junction 60 which switched off transistor 32 and permitted capacitor 30 to output ramp 1 at terminal 22 as a function of Iref supplied by ramp rate signal source 44. During the same period, switch 54 has connected ramp voltage signal source 46 to junction 62. Transistor 38 is now biased to conduct so that junction 62 is at a voltage level slightly less than that of $V_{DD}$ by approximately the amount of the voltage drop $V_{BE}$ across the junction of transistor 38. This specifically fixes the voltage at point 62 ($V_{DD}$-$V_{BE}$). Thus when the divide by two circuit 14 next moves the switches to the other position, the ramp starting voltage will be set at that voltage on junction 62. When then switch 54 switches from position 2 to position 5 and switch 52 switches from position 1 to position 2, the ramp begins at the same voltage as set at 62 and at the same rate as the previous ramp which had been provided to output terminal 22. The ramp produced by capacitor 36 also starts at the same time in the cycle because ramp starting signal source 42, now connected to position 4, provides the current I2 at junction 64 to cut off transistor 38 and allow capacitor 36 to begin to produce ramp 2 at terminal 24. While this is occurring, ramp voltage signal source 46 is connected by switch 54 to position 5 so that I1 is flowing and causing junction 66 to be fixed at a voltage which is approximately less than $V_{DD}$ by the amount of the drop, $V_{BE}$, across the junction of transistor 32. Thus by simply matching resistors 34 and 40, capacitors 30 and 36, and transistors 32 and 38, the series of ramps produced by generator system 10 is identical and will function to provide accurate, well-aligned pulse width modulated pulses, for the ramps produced at output terminals 22 and 24 all begin at the same moment in their respective cycles at the same voltages and with identical slopes.

Figure 3:
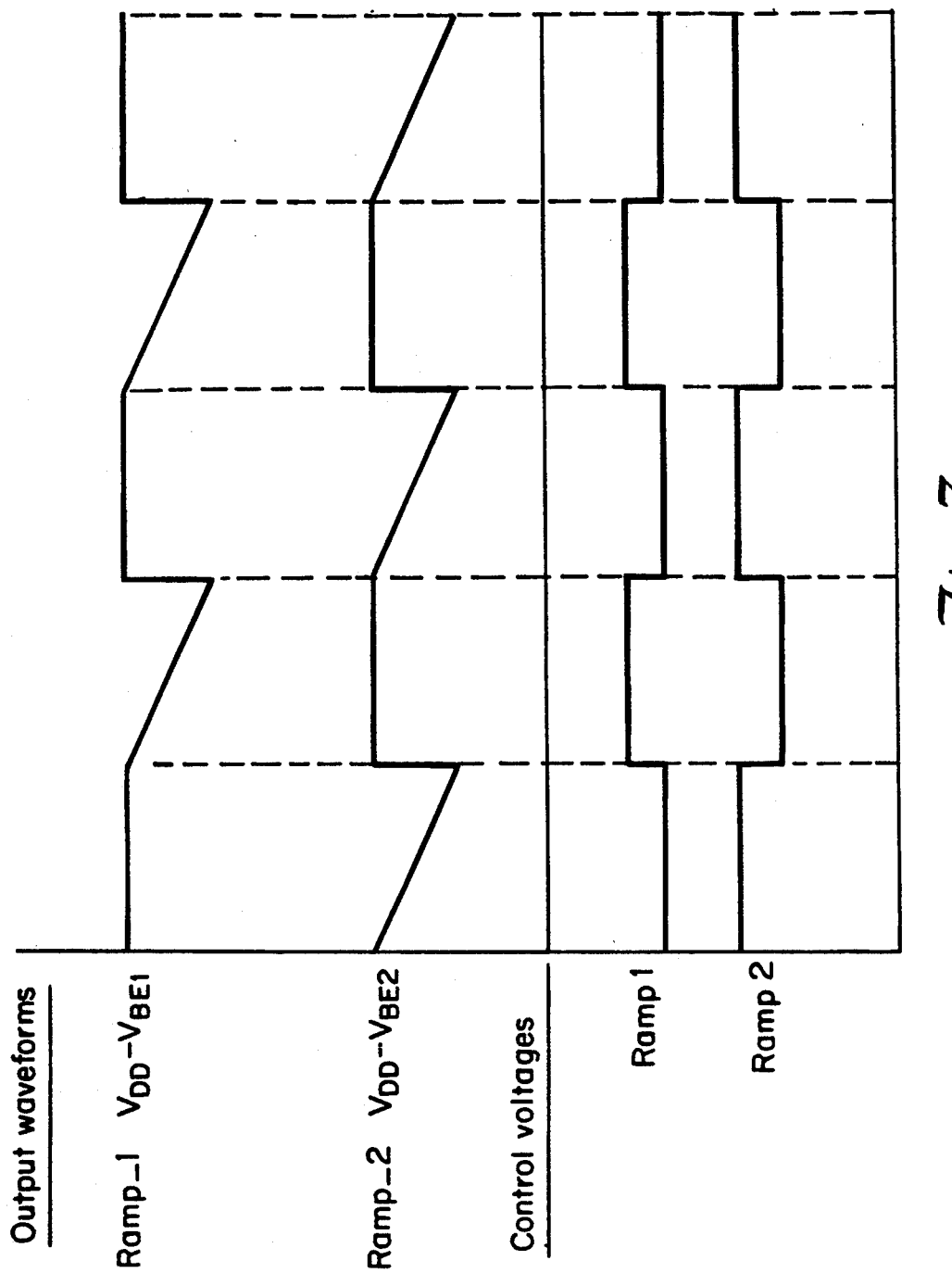
FIG. 3 shows output waveforms ramp__1 and ramp__2 and the corresponding voltage waveforms.

There is shown in FIG. 3 out waveforms ramp__1 and ramp__2, and control voltage waveform ramp 1 and ramp 2 generator and output from divide by two circuit 14. Waveform ramp__1, $V_{DD}$-$V_{BE1}$, is output from output 16a and waveform ramp__2, VDD-$V_{BE2}$, is output from output 16b. Control voltage waveform ramp 1 is applied to pos__1, pos·2 and pos__3 and ramp 2 is applied to pos__2, pos__4 and pos__5 of switches S1, S2 and S3.

Although the invention has been explained using a dual-ramp generator system and a divide by two circuit for defining the periods, this is not a necessary limitation of the invention, as any number of ramp generator circuits may be used accompanied by the necessary switching means and a suitable means for defining a number of periods commensurate with the number of ramp generator circuits.

Although specific features of the invention are shown in some drawings and not others, this is for convenience only as each feature may be combined with any or all of the other features in accordance with the invention.

Other embodiments will occur to those skilled in the art and are within the following claims:

What is claimed is:

1. An improved ramp generator system, comprising:
   a plurality of ramp generator circuits for producing a series of identical ramps;
   a ramp rate signal source for controlling the ramp slope;
   a ramp voltage signal source for establishing a starting voltage of the ramp;
   a ramp starting signal source for starting the ramp;

means for defining a plurality of ramp periods; and switching means, responsive to said means for defining, for alternately, sequentially connecting said ramp rate signal source and said ramp starting signal source to one of said ramp generator circuits, and said ramp voltage signal source to another of said ramp generator circuits for producing said series of identical ramps.

2. The improved ramp generator system of claim 1 in which said periods are equal.

3. The improved ramp generator system of claim 1 in which each of said ramp generator circuits includes an RC network and a switching device, said switching device includes a control terminal and said RC network includes a capacitive portion and a resistive portion.

4. The improved ramp generator system of claim 3 in which said ramp starting signal source is connected by said switching means to the control terminal of/said switching device.

5. The improved ramp generator system of claim 3 in which said ramp rate signal source is connected by said switching means to the capacitive portion of said RC network.

6. The improved ramp generator system of claim 3 in which said ramp voltage signal source is connected by said switching means to a load terminal of said switching device for fixing the ramp starting voltage at the supply voltage minus the voltage drop across said switching device.

7. The improved ramp generator system of claim 1 in which there are two ramp periods which differentially operate said switching means.

8. A differential dual-ramp generator system, comprising:

first and second ramp generator circuits for producing a series of identical ramps;

a ramp rate signal source for controlling the ramp slope;

a ramp voltage signal source for establishing the starting voltage of the ramp;

a ramp starting signal source for starting the ramp;

means for defining first and second ramp periods; and switching means, responsive to said means for defining, for alternately, sequentially connecting said ramp rate signal source and said ramp starting signal source to one of the first and second ramp generator circuits, and said ramp voltage signal source to the other of said ramp generator circuits for producing a series of identical ramps.

9. The improved ramp generator system of claim 8 in which said first and second periods are equal.

10. The improved ramp generator system of claim 8 in which each of said ramp generator circuits includes an RC network and a switching device, said switching device includes a control terminal and said RC network includes a capacitive portion and a resistive portion.

11. The improved ramp generator system of claim 10 in which said ramp starting signal source is connected by said switching means to the control terminal of said switching device.

12. The improved ramp generator system of claim 11 in which said ramp rate signal source is connected by said switching means to the capacitive portion of said RC network.

13. The improved ramp generator system of claim 11 in which said ramp voltage signal source is connected by said switching means to a load terminal of said switching device for fixing the ramp starting voltage at the supply voltage minus the voltage drop across said switching device.

14. The improved ramp generator system of claim 7 in which there are two ramp generator circuits.

* * * * *